US010784192B2

(12) United States Patent
Davis et al.

(10) Patent No.: US 10,784,192 B2
(45) Date of Patent: Sep. 22, 2020

(54) SEMICONDUCTOR DEVICES HAVING 3-DIMENSIONAL INDUCTIVE STRUCTURES

(71) Applicant: Micron Technology, Inc., Boise, ID (US)

(72) Inventors: James E. Davis, Meridian, ID (US); Kevin G. Duesman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/183,057

(22) Filed: Nov. 7, 2018

(65) Prior Publication Data
US 2020/0144182 A1    May 7, 2020

(51) Int. Cl.
| | |
|---|---|
| H01L 23/522 | (2006.01) |
| H01L 23/528 | (2006.01) |
| H01L 23/532 | (2006.01) |
| H01L 23/66 | (2006.01) |
| H01L 23/62 | (2006.01) |
| H01L 49/02 | (2006.01) |
| H01L 23/64 | (2006.01) |
| H01L 27/11578 | (2017.01) |
| H01L 27/11551 | (2017.01) |

(52) U.S. Cl.
CPC ...... *H01L 23/5227* (2013.01); *H01L 23/5283* (2013.01); *H01L 23/53257* (2013.01); *H01L 23/62* (2013.01); *H01L 23/645* (2013.01); *H01L 23/66* (2013.01); *H01L 28/10* (2013.01); *H01L 27/11551* (2013.01); *H01L 27/11578* (2013.01)

(58) Field of Classification Search
CPC ... H01L 23/5227; H01L 23/645; H01L 23/66; H01L 23/62; H01L 23/5283; H01L 23/53257; H01L 27/11551; H01L 27/11578; H01L 28/10
See application file for complete search history.

(56) References Cited

U.S. PATENT DOCUMENTS

| | | | |
|---|---|---|---|
| 2005/0139954 A1* | 6/2005 | Pyo ....................... | H01L 23/481 257/531 |
| 2009/0273429 A1* | 11/2009 | Nakamura .......... | H01F 17/0006 336/200 |
| 2015/0036407 A1* | 2/2015 | Nakajima ............ | H01Q 1/2283 365/63 |

OTHER PUBLICATIONS

Saito, M. et al., "A 2Gb/s 1.8pJ/b/chip Inductive-Coupling Through-Chip Bus for 128-Die NAND-Flash Memory Stacking", 2010 IEEE International Solid-State Circuits Conference, Feb. 10, 2010, Session 24, Dram & Flash Memories, © 2010 IEEE, 3 pages.

(Continued)

*Primary Examiner* — Feifei Yeung Lopez
(74) *Attorney, Agent, or Firm* — Perkins Coie LLP

(57) ABSTRACT

Semiconductor devices having inductive structures, and associated systems and methods, are disclosed herein. In one embodiment, a semiconductor device includes a substrate and at least one circuit component coupled to the substrate. The semiconductor device can further include an inductive structure carried by the substrate and having a stack of alternating first and second layers. In some embodiments, the first layers comprise an oxide material and the second layers each include a coil of conductive material. The coils of conductive material can be electrically coupled (a) together to form an inductor and (b) to the at least one circuit component.

20 Claims, 9 Drawing Sheets

(56) References Cited

OTHER PUBLICATIONS

Saito, M. et al., "47% Power Reduction and 91% Area Reduction in Inductive-Coupling Programmable Bus for NAND Flash Memory Stacking", IEEE Transactions on Circuits and Systems—I: Regular Papers, vol. 57, No. 9, Sep. 2010, © 2010 IEEE, pp. 2269-2278.

* cited by examiner

SEMICONDUCTOR DEVICES HAVING 3-DIMENSIONAL INDUCTIVE STRUCTURES

TECHNICAL FIELD

The present technology generally relates to semiconductor devices having 3-dimensional (3D) inductive structures, and more particularly relates to memory devices having inductive structures comprising vertically-stacked conductive loops.

BACKGROUND

Memory devices are widely used to store information related to various electronic devices such as computers, wireless communication devices, cameras, digital displays, and the like. Information is stored by programming different states of a memory cell. Various types of memory devices exist, such as non-volatile memory devices (e.g., NAND Flash memory devices) and volatile memory devices (e.g., dynamic RAM (DRAM), synchronous dynamic RAM (SDRAM), etc.).

Improving memory devices, generally, may include increasing memory cell density, increasing read/write speeds or otherwise reducing operational latency, increasing reliability, increasing data retention, reducing power consumption, or reducing manufacturing costs, among other metrics. One such other metric is reducing the size or footprint of the memory devices and/or components of the memory devices. Manufacturers achieve size reduction through scaling, various architectural decisions, and/or logic optimizations. One difficulty with reducing the size of a memory device and/or increasing the speed or bandwidth of a memory devices is that such improvements often result in decreased signal integrity—for example, as a result of increased parasitic capacitance within the memory device as conductive members carrying different voltages are positioned nearer to one another or are required to carry higher or more frequent voltages. Such parasitic capacitance can diminish the speed and performance of the memory device.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
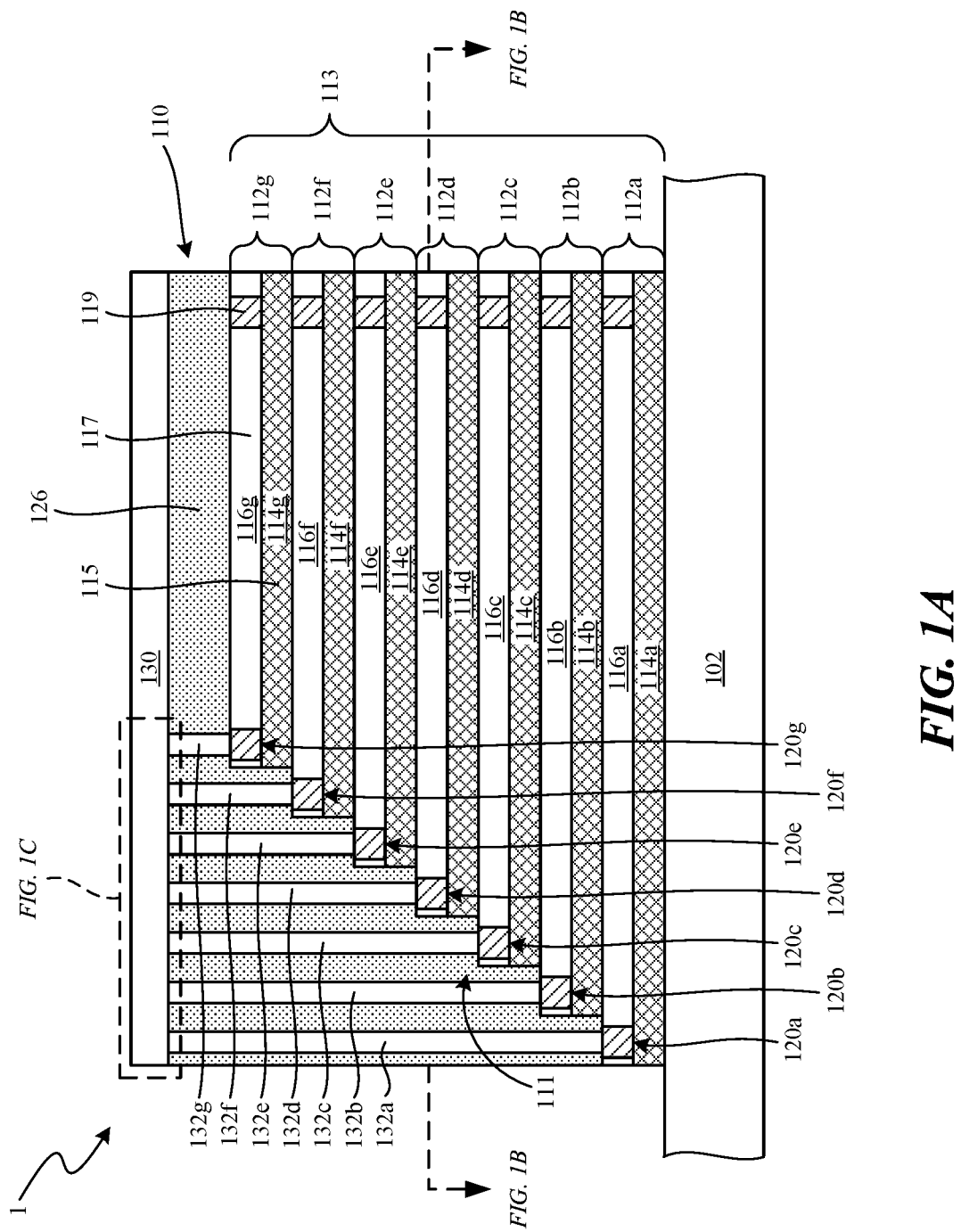
FIG. 1A is a side cross-sectional view of a portion of a semiconductor device including an inductive structure in accordance with an embodiment of the present technology.

Specific details of several embodiments of semiconductor devices having inductive structures, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-3.

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array architectures ("three-dimensional (3D) NAND memory arrays"). A vertical memory array can include, for example, semiconductor pillars extending through openings in tiers of conductive layers or structures (e.g., word line plates, control gate plates, etc.) and electrically insulative materials at each junction of the semiconductor pillars and the conductive structures. Such a configuration permits a greater per-area number of transistors to be located in a memory device by building the array upward (e.g., vertically) on a substrate, as compared to structures with conventional planar (e.g., two-dimensional) arrangements of transistors. Such vertical memory arrays can further include electrical connections between the conductive structures and access lines (e.g., word lines) so that memory cells in the vertical memory array can be uniquely selected for writing, reading, or erasing operations. One method of forming such an electrical connection includes forming a "stair step" structure at edges of the tiers of conductive structures. The stair step structure includes individual "steps" defining contact regions of the conductive structures upon which conductive members (e.g., conductive contacts) can be positioned to provide electrical access to the conductive structures.

Embodiments of the present technology include inductive structures that can have similar architectures to and can utilize similar manufacturing processes as vertical memory arrays. In several of the embodiments described below, for example, an inductive structure includes a plurality of tiers arranged in a stack on a substrate, wherein individual ones of the tiers include a first layer and a second layer over the first layer. The first layers can comprise an electrically insulative material such as silicon oxide, and the second layers can each include a coil of electrically conductive material (e.g., tungsten) formed therein. The coils of electrically conductive material can be electrically coupled together to form an inductor, and the inductor can be electrically coupled to a vertical memory array and/or another electrical circuit component.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-3. For example, some details of semiconductor devices well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1A is a side cross-sectional view of a portion of a semiconductor device 1, such as a non-volatile (e.g., NAND Flash) memory device in accordance with an embodiment of the present technology. In the illustrated embodiment, the semiconductor device 1 includes a substrate 102 and an inductive structure 110 carried by (e.g., formed on) the substrate 102. The substrate 102 can include a redistribution layer, an interposer, a printed circuit board, a dielectric spacer, a semiconductor die, or another suitable substrate. The substrate 102 can further carry other passive and/or active electrical circuit components (not pictured). In some embodiments, for example, the semiconductor device 1 can further include a plurality of 3D-NAND memory arrays formed on the substrate 102. In some embodiments, one or more of the 3D-NAND memory arrays and/or other electrical circuit components can be electrically coupled to the inductive structure 110.

The inductive structure 110 includes a plurality of tiers 112 (individually labeled as tiers 112a-112g) arranged in a stack 113 on the substrate 102. In the illustrated embodiment, the inductive structure 110 includes seven of the tiers 112 for ease of illustration. In practice, however, the inductive structure 110 can include many more tiers such as, for example, more than ten tiers, more than twenty tiers, more than fifty tiers, more than one hundred tiers, etc. In other embodiments, the inductive structure 110 can have fewer than seven tiers. Each of the tiers 112 can have a different lateral width (e.g., in a direction generally parallel to the substrate 102). More particularly, the lowermost tier 112a can have the greatest lateral width, and each successive one of the tiers 112b-112g stacked on the lowermost tier 112a can have a smaller lateral width than the ones of the tiers 112 stacked below. Accordingly, the stack 113 of tiers 112 can define a stepped portion 111 (e.g., a staircase portion) at which a portion (e.g., a peripheral region) of each one of the tiers 112 is exposed. In other embodiments, at least a portion of the tiers 112 can have the same lateral width.

In the illustrated embodiment, each of the tiers 112 includes a first layer 114 (individually labeled as first layers 114a-114g) and a second layer 116 (individually labeled as second layers 116a-116g) formed over the first layer 114. Thus, the inductive structure 110 includes a plurality of alternating (e.g., interleaved) first layers 114 and second layers 116. In some embodiments, each of the layers 114, 116 is generally planar and has substantially the same thickness. In other embodiments, the layers 114, 116 can have different and/or varying thicknesses (e.g., some or all of the first layers 114 can be thicker than the second layers 116, some or all of the second layers 116 can be thicker than the first layers 114, etc.).

In general, the first layers 114 are formed from (e.g., comprise, include, etc.) at least one electrically insulative material (e.g., a dielectric material) and the second layers 116 are formed from at least one electrically insulative material and at least one electrically conductive material. In some embodiments, for example, the first layers 114 comprise an oxide material 115, and the second layers 116 comprise a nitride material 117 and a conductive material 119. In some embodiments, the conductive material 119 can be a metal, metal alloy, a conductive-metal containing material, etc. In a particular embodiment, (i) the oxide material 115 comprises silicon dioxide, (ii) the nitride material 117 comprises silicon nitride, and (iii) the conductive material 119 comprises tungsten.

Figure 1B:
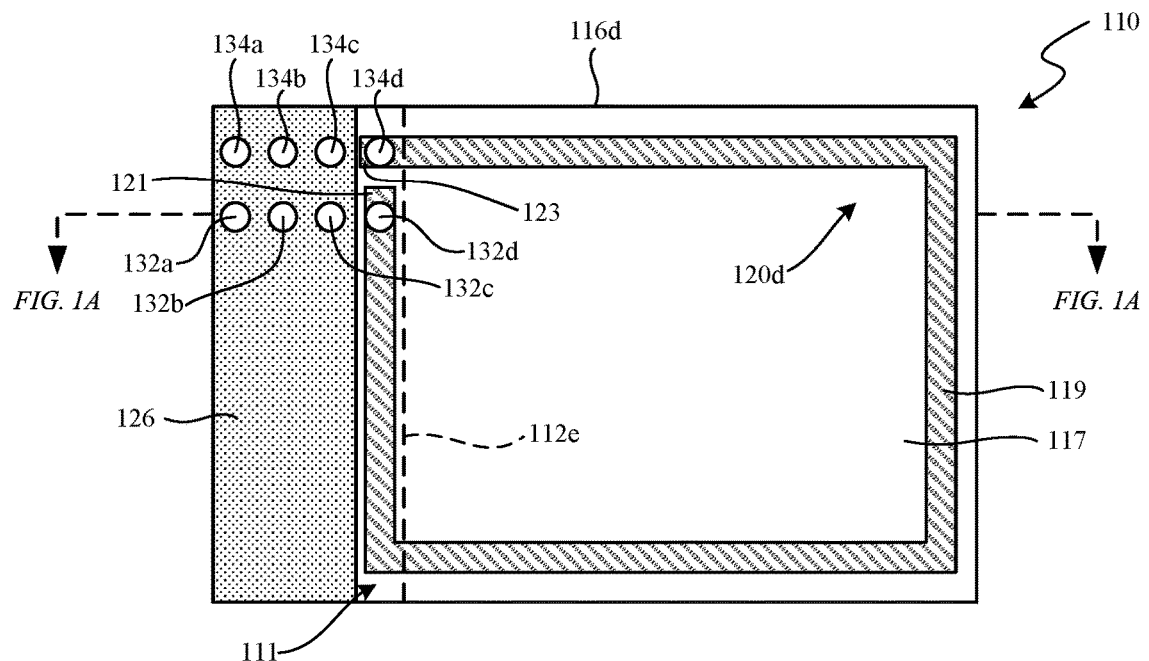
FIG. 1B is a top cross-sectional view of the inductive structure of the semiconductor device shown in FIG. 1A in accordance with an embodiment of the present technology.

The conductive material 119 in each of the second layers 116 can form a loop 120 (e.g., a ring, coil, etc.; individually labeled as loops 120a-120g) having a portion that is exposed (e.g., electrically accessible) at the stepped portion 111 of the stack 113. More specifically, FIG. 1B is a top cross-sectional view of the inductive structure 110 taken through the second layer 116d of the (fourth) tier 112d shown in FIG. 1A, in accordance with an embodiment of the present technology. In the illustrated embodiment, the conductive material 119 of the second layer 116d forms the loop 120d having at least a first end portion 121 and a second end portion 123 that are exposed at the stepped portion 111 of the stack 113. That is, the end portions 121, 123 can be positioned on the peripheral region of the tier 112d such that they are laterally outboard of (e.g., not beneath) the (fifth) tier 112e that is positioned directly above the tier 112d. In the illustrated embodiment, the loop 120d has a generally planar, rectilinear shape, and includes only a single winding. In other embodiments, the loop 120d can have other suitable shapes and configurations (e.g., circular, polygonal, irregular, etc.), can be formed over more or less of the area of the second layer 116d, and can include more or fewer windings (e.g., as shown in FIGS. 3A and 3B). In some embodiments, the conductive material 119 forming the loop 120d can have a width of between about 200-1200 nm (e.g., about 470 nm, about 940 nm, etc.).

Referring to FIGS. 1A and 1B together, the loops 120a-120c and 120e-120g can be generally similar to the loop 120d shown in detail in FIG. 1B. In some embodiments, the lowermost loop 120a can have a greatest dimension (e.g., area, radius, etc.), and the dimension of each successive one of the loops 120b-120g stacked above the lowermost loop 120a can be smaller than the dimension of the loop(s) 120 stacked below. In other embodiments, the loops 120 can each be formed to have generally the same dimensions, or can be formed such that one or more upper ones of the loops 120 have a greater dimension than a corresponding dimension of one or more lower ones of the loops 120. Moreover, in some embodiments, the loops 120 can be formed in only some of the second layers 116 (e.g., the number of second layers 116 can be greater than the number of loops 120), or a single second layer 116 can include more than one loop 120 (e.g., the number of loops 120 can be greater than the number of second layers 116).

The inductive structure 110 further includes an electrically insulative material 126 formed over (i) the stepped portion 111 of the stack 113 and (ii) an upper surface of the second layer 116g of the (uppermost) tier 112g. The insulative material 126 can be a passivation, dielectric, or other suitable insulating material such as, for example, silicon oxide, tetraethyl orthosilicate (TEOS), etc. The inductive structure 110 further includes a metallization structure 130 formed on and/or over at least a portion of the insulative material 126 and/or the stack 113. A plurality of first conductive members 132 (individually labeled as first conductive members 132a-132g) and a plurality of second conductive members 134 (individually labeled as second conductive members 134a-134g; obscured in FIG. 1A) can extend through the insulative material 126 to electrically couple the metallization structure 130 to the loops 120.

More specifically, the conductive members 132, 134 can extend between and electrically connect the metallization structure 130 and the portion of the loops 120 exposed at the stepped portion 111 of the stack 113. For example, referring to FIG. 1B, the first conductive member 132d can be positioned on and/or electrically coupled to the first end portion 121 of the loop 120d, and the second conductive member 134d can be positioned on and/or electrically coupled to the second end portion 123 of the loop 120d. In other embodiments, the conductive members 132, 134 can be electrically coupled to other portions of the loops 120 (e.g., other than an end portion). The conductive members 132, 134 can be conductive pillars, columns, studs, etc., and can be formed from one or more conductive materials such as, for example, copper, tungsten, etc. In some embodiments, the conductive members 132, 134 are identical (e.g., having the same cross-sectional area and shape). In other embodiments, the conductive members 132, 134 can have differing cross-sectional areas, shapes, etc. Moreover, while the conductive members 132, 134 are illustrated as generally linearly aligned in FIGS. 1A and 1B, in other embodiments the conductive members 132, 134 can have other (e.g., non-aligned arrangements) and/or can extend in directions other than vertically through the insulative material 126.

Figure 1C:
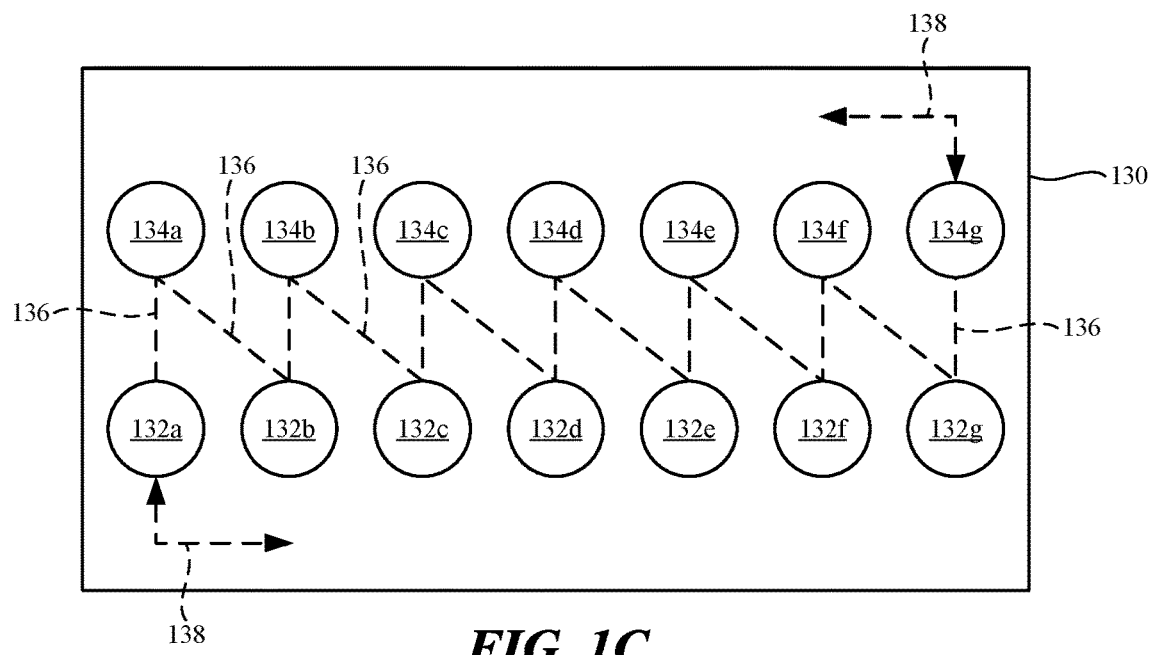
FIG. 1C is a schematic view of a metallization structure of the semiconductor device shown in FIG. 1A in accordance with an embodiment of the present technology.

The metallization structure 130 can be, for example, a redistribution layer or other structure (e.g., including a plurality of conductive traces, vias, routings, etc.) that is configured to electrically couple one or more of the loops 120 together. FIG. 1C, for example, is a schematic view of a portion of the metallization structure 130 and the conductive members 132, 134 shown in FIG. 1A in accordance with an embodiment of the present technology. In the illustrated embodiment, the metallization structure 130 defines a plurality of first electrical paths 136 (e.g., routings, traces, etc.) that electrically couple individual ones of the first conductive members 132 to corresponding ones of the second conductive members 134 (e.g., to electrically coupled adjacent pairs of the loops 120 in the stack 113). For example, the metallization structure 130 can electrically couple the second conductive member 134d of the (fourth) tier 112d to the first conductive member 132e of the (fifth) tier 112e. Therefore, in the illustrated embodiment, the metallization structure 130 electrically couples the loops 120 together in series to define a continuous electrical path that forms an inductor. In other embodiments, the loops 120 can be electrically coupled together in other suitable arrangements.

The metallization structure 130 can further define second electrical paths 138 for coupling the inductive structure 110 to other electrical circuit components (not pictured) such as one or more bond pads of the semiconductor device 1 and/or one or more 3D-NAND memory arrays formed on the substrate 102. In this manner, the inductive structure 110 can be coupled to a circuit (e.g., and I/O (in/out) data circuit) of the semiconductor device 1 and/or a circuit that is external to the semiconductor device 1. The inductance of a circuit depends in part on the geometry of the current path through the circuit. In particular, the number of loops (e.g., windings or turns) in the current path can increase the magnetic flux generated by the current and thus the inductance of the circuit. Therefore, the multiple loops 120 of the inductive structure 110 can increase the total inductance of a circuit coupled to the inductive structure 110. Moreover, the number of loops 120 of the inductive structure 110 can be equal to, for example, the number of tiers 112 in the stack 113. Therefore, the inductance of the inductive structure 110 can be selected based at least in part on the number of tiers 112 in the stack 113 and/or the configuration of the loops 120 (e.g., the dimensions of the loops 120).

Semiconductor manufacturers are continually striving to increase the inductance of semiconductor devices as requirements for speed and data rates continue to increase, and analog (rather than digital) signaling becomes more prevalent. The inductive structure 110 can advantageously provide a large inductance while consuming relatively little space within the semiconductor device 1 due to the vertical stacking of the loops 120. In some embodiments, the inductive structure 110 can form a portion of a RLC shunt that can effectively increase the signal integrity of, for example, I/O data signals to the semiconductor device 1. In some embodiments, the inductive structure 110 can form part of an electrostatic discharge (ESD) circuit that can effectively protect other components in the semiconductor device 1 from large voltage discharges that may damage those components. For example, the inductive structure 110 can be configured to trigger an ESD protection circuit. In still further embodiments, the inductive structure 110 can form part of a signaling circuit—for example, an inductive signaling circuit that permits signaling between separate (e.g., stacked) semiconductor devices.

FIGS. 2A-2K are side cross-sectional views illustrating various stages in a method of manufacturing the inductive structure 110 in accordance with embodiments of the present technology. Generally, the inductive structure 110 can be manufactured, for example, as a discrete device or as part of a larger wafer or panel. In wafer-level or panel-level manufacturing, a larger structure is formed before being singulated to form a plurality of individual structures. For ease of explanation and understanding, FIGS. 2A-2K illustrate the fabrication of a single inductive structure 110. However, one skilled in the art will readily understand that the fabrication of the inductive structure 110 can be scaled to the wafer and/or panel level—that is, to include many more components so as to be capable of being singulated into two or more inductive structures 110—while including similar features and using similar processes as described herein.

Figure 2A:
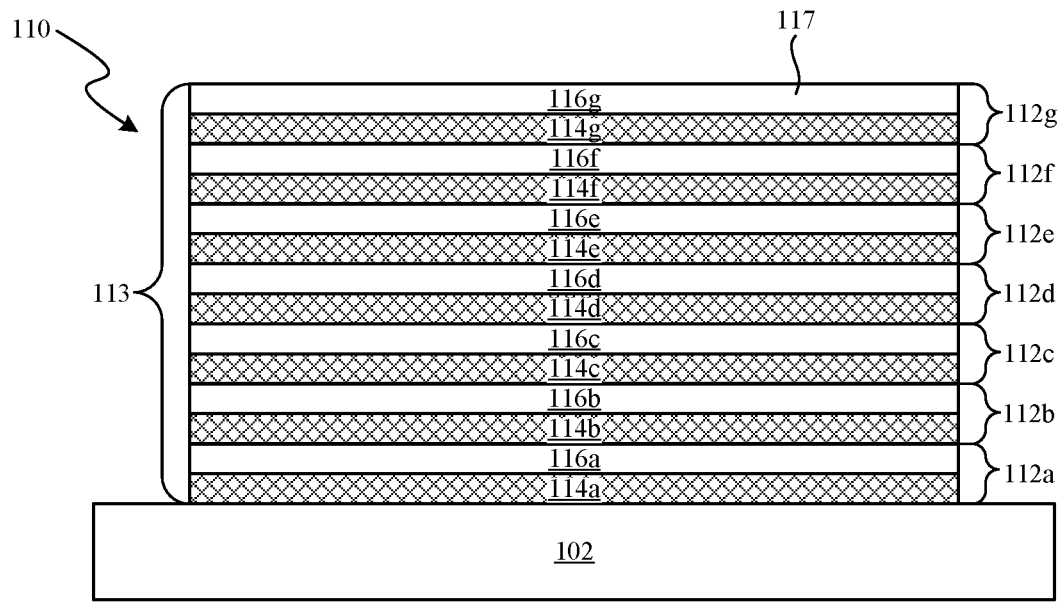
FIGS. 2A-2K are side cross-sectional views illustrating various stages in a method of manufacturing the inductive structure of the semiconductor device shown in FIG. 1A in accordance with embodiments of the present technology.

Referring first to FIG. 2A, fabrication of the inductive structure 110 begins with the formation of the stack 113 of the tiers 112 on the substrate 102. The alternating first layers 114 and second layers 116 can be formed using processes well known in the art such as, for example, film deposition, chemical vapor deposition, physical vapor deposition, atomic layer deposition, spin coating, and/or other suitable techniques. Upon formation, the second layers 116 comprise only the nitride material 117 and do not yet include the conductive material 119.

Figure 2B:
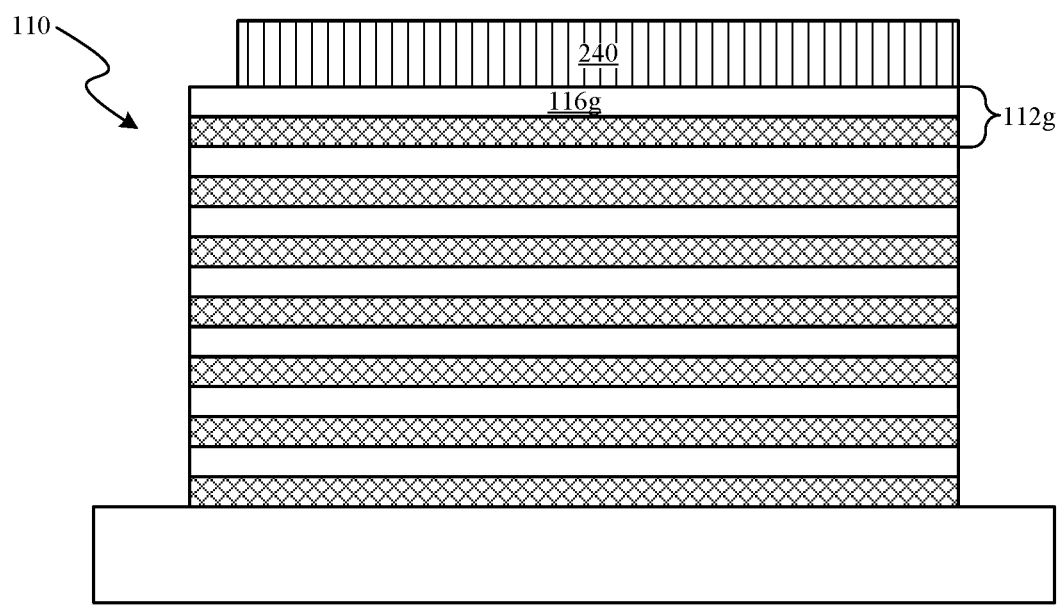

Referring to FIG. 2B, at this stage of the method a mask 240 (e.g., a photomask) is formed on an upper surface of the second layer 116g of the uppermost (seventh) tier 112g. The mask 240 can be a resist material or other suitable mask, and can have a width that is less than a width of the tier 112g after it is initially formed (FIG. 3A) such that a portion of the tier 112g is exposed from the mask 240.

Figure 2C:
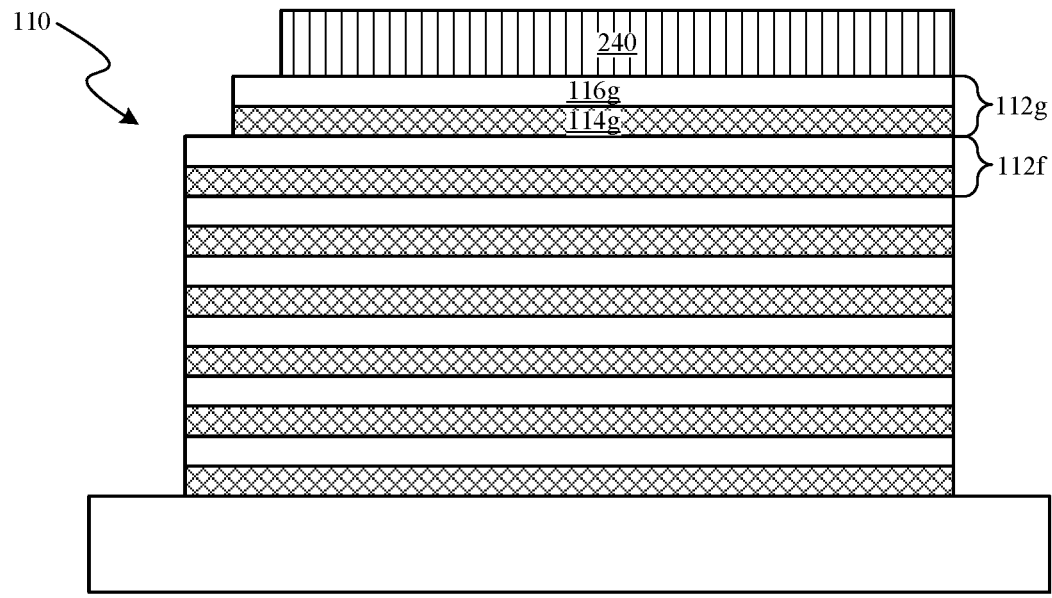

FIG. 2C illustrates the inductive structure 110 after the exposed portion of the tier 112g has been removed using, for example, a suitable etching process (e.g., an anisotropic etching process, a dry etching process, a plasma etching process, wet etching process, and/or other suitable etching process). As shown, portions of both the layers 114g and 116g are removed. After removing the portions of the layers 114g and 116g, a portion of the (sixth) tier 112f is exposed. FIG. 2C further illustrates the inductive structure 110 after a portion of the mask 240 has been selectively removed to expose another portion of the tier 112g. The portion of the mask 240 can be removed using plasma etching, wet etching, chemical-mechanical planarization, or other suitable techniques.

Figure 2D:
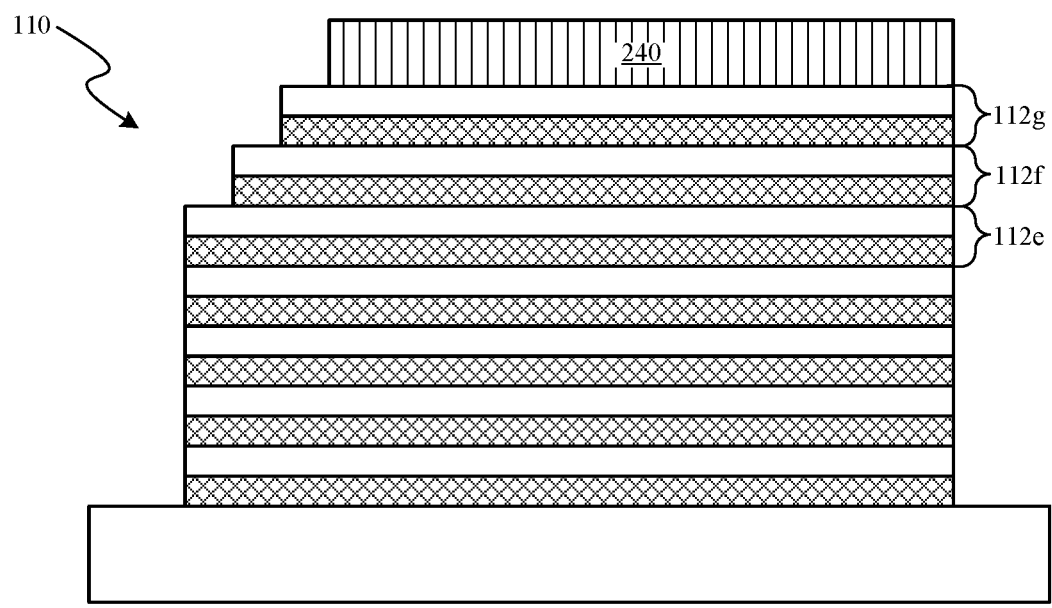
Figure 2E:
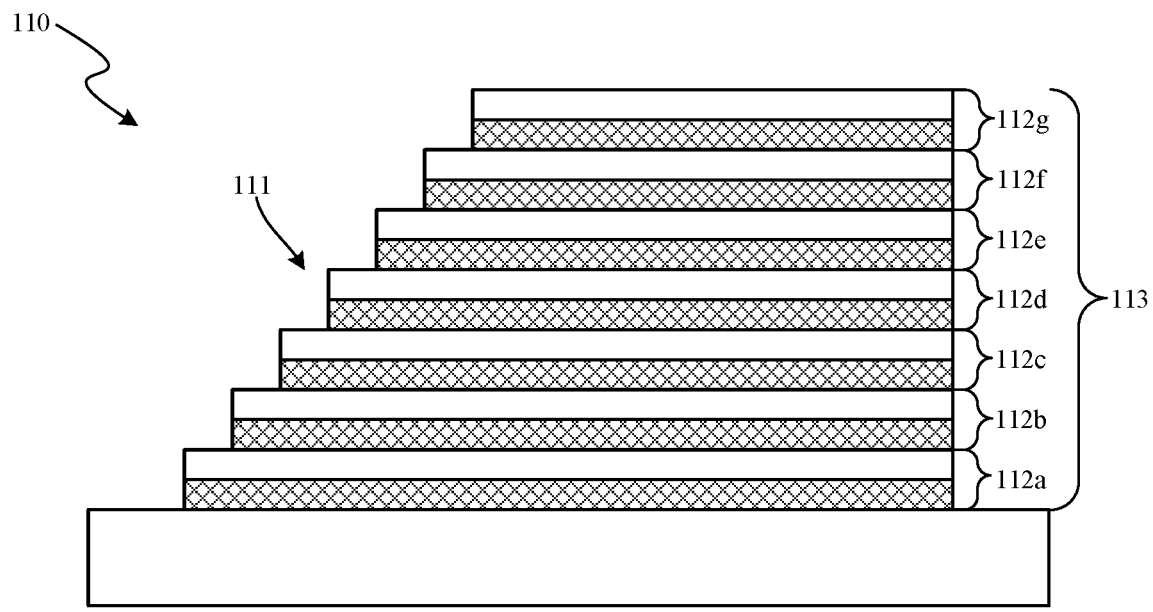

FIG. 2D illustrates the inductive structure 110 after the exposed portions of the tiers 112f and 112g have been removed to expose a portion of the (fifth) tier 112e. FIG. 2D further illustrates the inductive structure 110 after a portion of the mask 240 has been selectively removed to expose another portion of the tier 112g. As shown in FIG. 2E, the process of (i) removing a portion of the mask 240 and subsequently (ii) removing (e.g., etching) the stack 113 of the tiers 112 can be repeated to form the stepped portion 111 of the stack 113. Once the stepped portion 111 is fully formed, the mask 240 can be removed as shown in FIG. 2E.

Figure 2F:
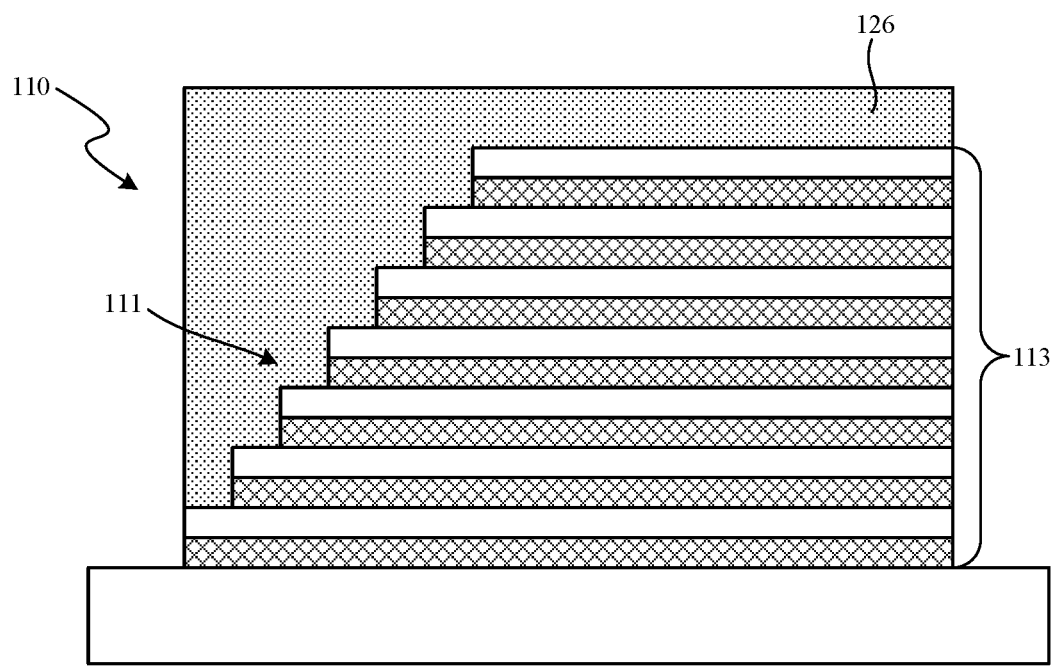
Figure 2G:
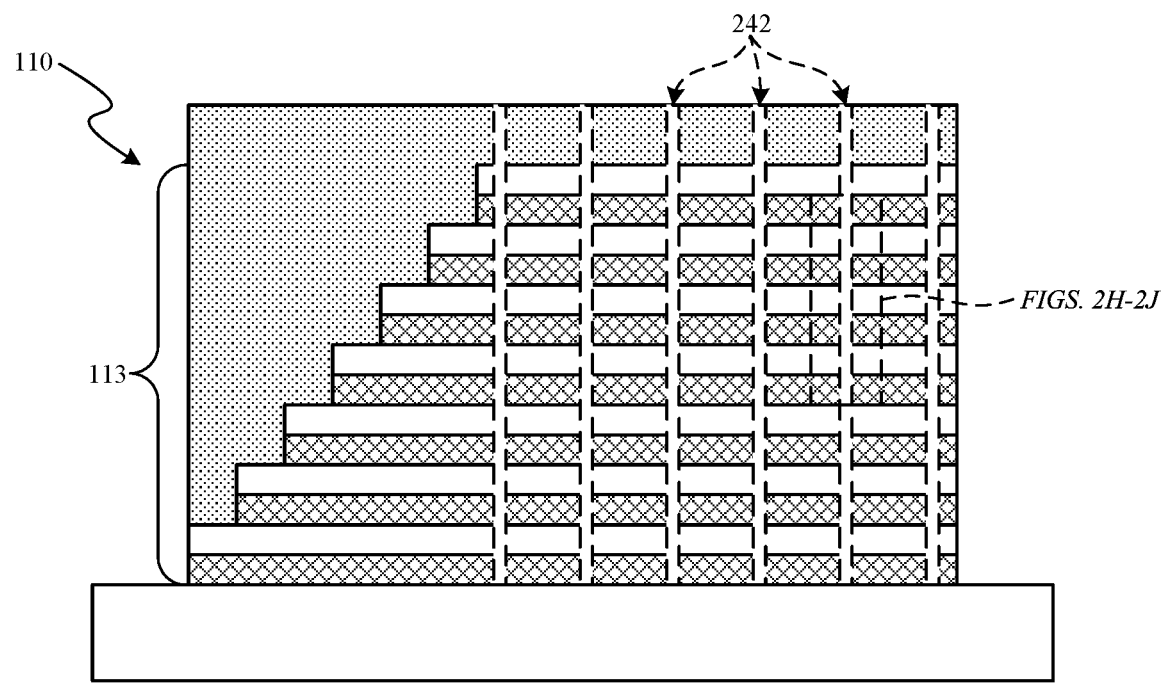

Referring to FIG. 2F, at this stage of the method the insulative material 126 is deposited or otherwise formed over (i) the stepped portion 111 of the stack 113 and (ii) the upper surface of the second layer 116g of the uppermost tier 112g. In some embodiments, once deposited, the insulative material 126 can be cured by UV light, chemical hardeners, heat, or other suitable curing methods known in the art. FIG. 2G illustrates the inductive structure 110 after etching a plurality of high-aspect ratio holes 242 (shown schematically) through the stack 113. The high-aspect ratio holes 242 can be formed using photolithography and/or etching processes known in the art.

Figure 2H:
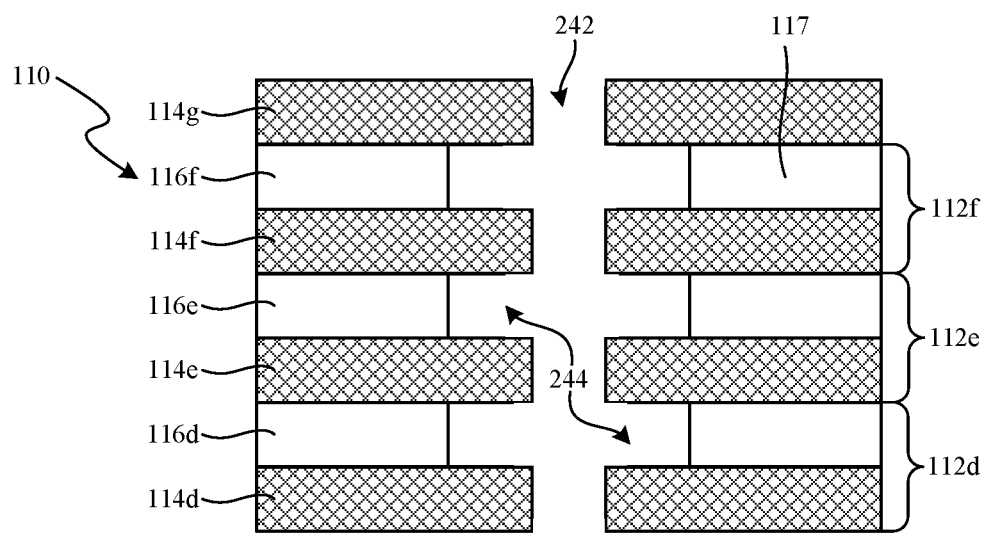
Figure 2I:
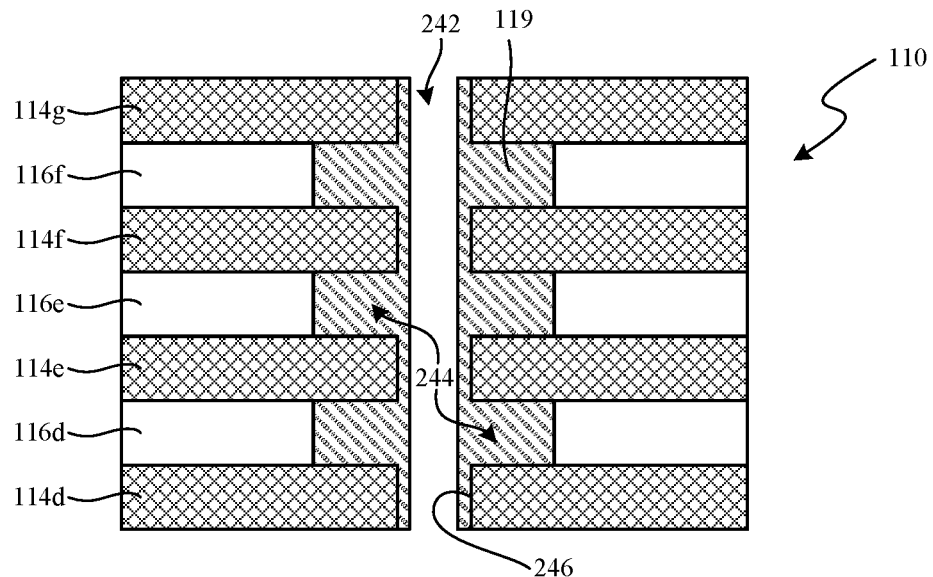
Figure 2J:
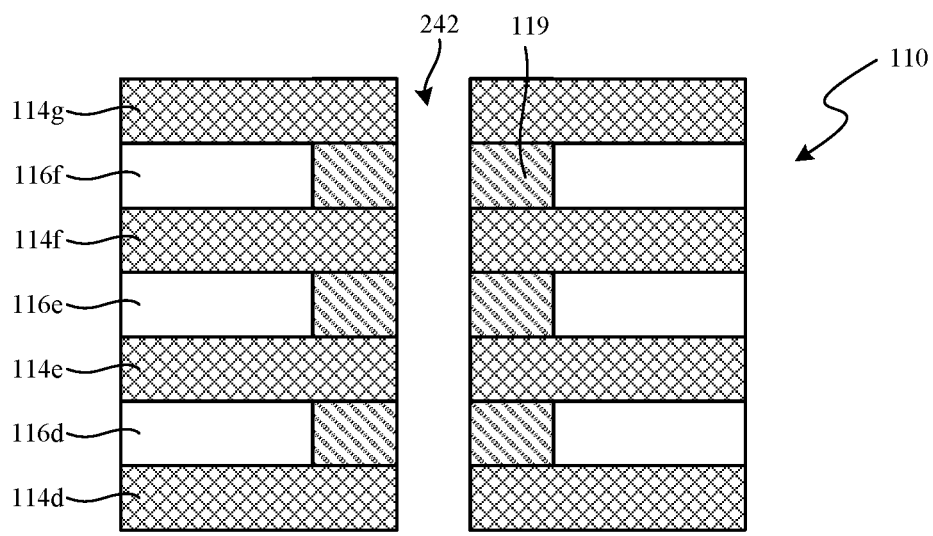

FIGS. 2H-2J are enlarged views illustrating subsequent processing steps on a portion of the stack 113 shown in FIG. 2G. Referring to FIG. 2F, at this stage of the method the second layers 116 are selectively removed (e.g., etched back) to form one or more recesses 244 in the second layers 116. In some embodiments, for example, a nitride-selective etchant (e.g., a wet or dry etch material) can be introduced into the high-aspect ratio holes 242 to selectively remove the nitride material 117 of the second layers 116.

FIG. 2I illustrates the inductive structure 110 after depositing the conductive material 119 in the high-aspect ratio holes 242 and in the recesses 244. The conductive material 119 can be deposited via chemical vapor deposition, physical vapor deposition, atomic layer deposition, spin coating, electroplating, electro-less plating, and/or other suitable techniques. As further shown in FIG. 2I, after deposition, the conductive material 119 can at least partially cover or coat a sidewall 246 of the inductive structure 110 that defines the high-aspect ratio hole 242. To isolate the conductive material 119 to the second layers 116 (and prevent electrical shorting), the conductive material 119 can be etched or otherwise removed from the high-aspect ratio holes 242 as shown in FIG. 2J.

In the embodiments illustrated in FIGS. 2H-2J, the recesses 244 are formed in each of the second layers 116 and the conductive material 119 is formed in each of the recesses 244. In general, however, the manufacturing stages illustrated in FIGS. 2H-2J can include selectively masking some or all of the high-aspect ratio holes 242 and/or portions of the high-aspect ratio holes 242 to form the desired shape and placement of the loops 120 within the second layers 116.

Figure 2K:
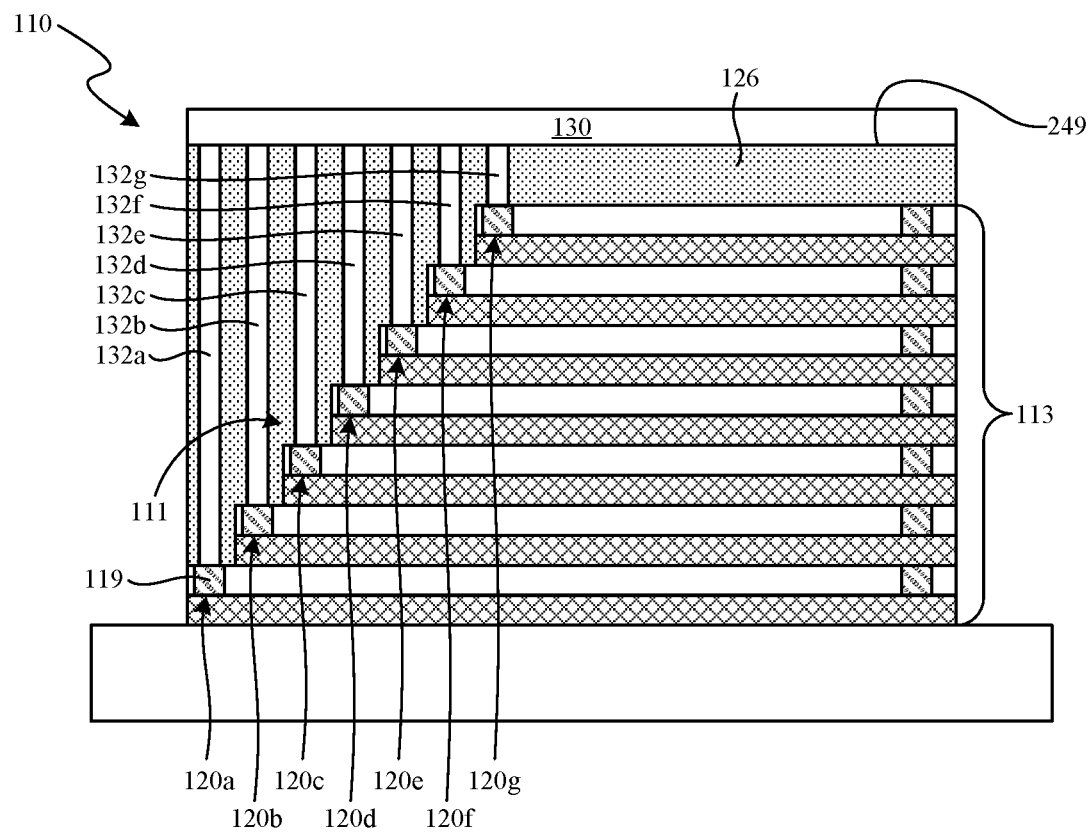

FIG. 2K, for example, shows the inductive structure 110 after forming the loops 120 in the second layers 116. FIG. 2K further illustrates the inductive structure 110 after forming the first conductive members 132 and the second conductive members 134 (obscured in FIG. 2K). The conductive members 132, 134 can be formed by (i) etching holes through the insulative material 126 from an upper surface 249 of the insulative material 126 to the portions of the conductive material 119 exposed at the stepped portion 111 of the stack 113, and (ii) depositing a conductive material into the holes etched in the insulative material 126 (e.g., via chemical vapor deposition, physical vapor deposition, atomic layer deposition, spin coating, electroplating, electro-less plating, and/or other suitable techniques). In some embodiments, the conductive material 119 exposed at the stepped portion 111 of the stack 113 can serve as an etch-stop that inhibits further etching of the inductive structure 110.

FIG. 2K also illustrates the inductive structure 110 after formation of the metallization structure 130 on the upper surface 249 of the insulative material 126 and over upper end portions of the conductive members 132, 134. The metallization structure 130 can be formed by an additive build up process (e.g., depositing one or more layers of insulative and conductive material on the upper surface 249 of the insulative material 126), by directly electrically connecting the upper end portions of the conductive members 132, 134 (e.g., via metal traces, wirebonds, etc.), and/or by other suitable methods.

Notably, the method of manufacturing the inductive structure 110 illustrated in FIGS. 2A-2K can include some steps generally similar to the fabrication of a 3D-NAND memory array. As described in detail above, for example, the method can include (i) forming a structure of alternating oxide and nitride layers having a staircase, (ii) etching high aspect-ratio holes through the structure, (iii) and selectively removing some or all of the nitride layers. However, instead of forming a plurality of memory cells electrically coupled to the plurality of word lines, each tier of the structure can be formed to include one of the loops 120 of conductive material 119 (FIGS. 2H-2J). Accordingly, in some embodiments, the semiconductor device 1 can be a 3D-NAND memory device (e.g., having 3D-NAND memory arrays on the substrate 102) and the inductive structure 110 can be formed as an extension of the process used to form the 3D-NAND memory arrays.

Figure 3:
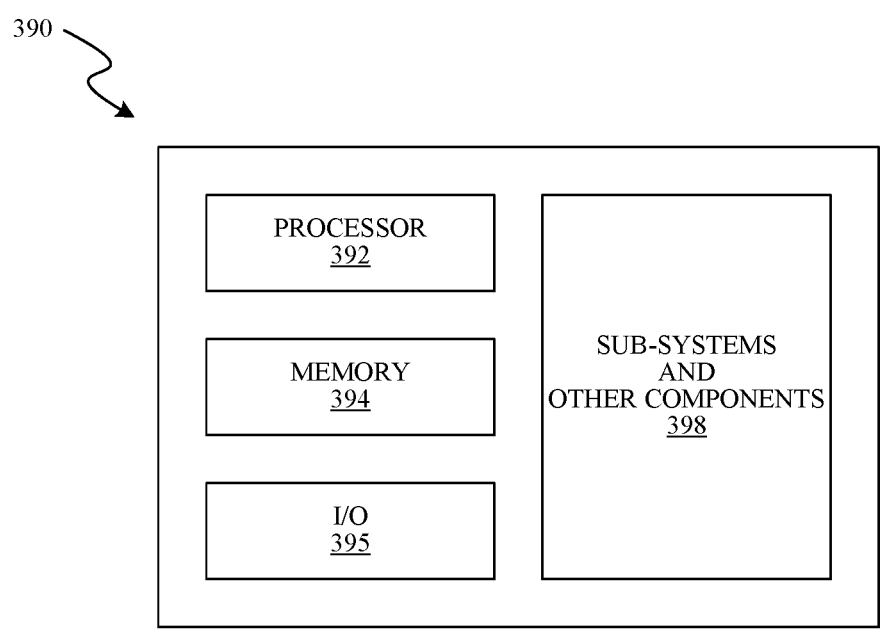
FIG. 3 is a schematic view of a system that includes a semiconductor device in accordance with embodiments of the present technology.

Any one of the semiconductor devices and/or packages having the features described above with reference to FIGS. 1A-2K can be incorporated into any of a myriad of larger and/or more complex systems, a representative example of which is system 390 shown schematically in FIG. 3. The system 390 can include a processor 392, a memory 394 (e.g., SRAM, DRAM, flash, and/or other memory devices), input/output devices 395, and/or other subsystems or components 398. The semiconductor dies and/or packages described above with reference to FIGS. 1A-2K can be included in any of the elements shown in FIG. 3. The resulting system 390 can be configured to perform any of a wide variety of suitable computing, processing, storage, sensing, imaging, and/or other functions. Accordingly, representative examples of the system 390 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 390 include lights, cameras, vehicles, etc. With regard to these and other example, the system 390 can be housed in a single unit or distributed over multiple interconnected units, for example, through a communication network. The components of the system 390 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. An inductive structure comprising:
   a substrate;
   a plurality of tiers arranged in a stack on the substrate, wherein—
     the stack of tiers includes a stepped portion,
     individual ones of the tiers include (a) a peripheral region that is exposed from the stack at the stepped portion, (b) a first layer, and (c) a second layer over the first layer, and
     the first layer includes an electrically insulative material;
   a plurality of loops of electrically conductive material, wherein the loops are formed in corresponding ones of the second layers, wherein the loops are electrically accessible at the stepped portion, and wherein the loops are electrically coupled together to form an inductor;
   a metallization structure; and
   a plurality of conductive members extending between the stepped portion of the stack and the metallization structure, wherein the conductive members electrically couple the metallization structure to the loops.

2. An inductive structure comprising:
   a substrate;
   a plurality of tiers arranged in a stack on the substrate, wherein—
     the stack of tiers includes a stepped portion,
     individual ones of the tiers include (a) a peripheral region that is exposed from the stack at the stepped portion, (b) a first layer, and (c) a second layer over the first layer, and
     the first layer includes an electrically insulative material;
   a plurality of loops of electrically conductive material, wherein the loops are formed in corresponding ones of the second layers, wherein the loops are electrically accessible at the stepped portion, and wherein the loops are electrically coupled together to form an inductor;
   a metallization structure;
   a plurality of conductive members extending between the stepped portion of the stack and the metallization structure, wherein the conductive members electrically couple the metallization structure to the loops; and
   an oxide material over the stepped portion of the stack, wherein the conductive members extend generally vertically through the oxide material.

3. The inductive structure of claim 1 wherein individual ones of the loops include multiple planar windings.

4. The inductive structure of claim 1 wherein the loops are electrically coupled together in series.

5. The inductive structure of claim 1 wherein—
   the electrically insulative material is an oxide material;
   the electrically conductive material is tungsten; and
   the second layers further include a nitride material at least partially around the tungsten.

6. The inductive structure of claim 1 wherein the plurality of tiers includes more than one hundred tiers.

7. The inductive structure of claim 1 wherein the loops have different radii.

8. The inductive structure of claim 1 wherein the inductor is configured to be electrically coupled to a 3D-NAND memory array.

9. The inductive structure of claim 1, further comprising a circuit component carried by the substrate, wherein the circuit component is electrically coupled to the inductor.

10. The inductive structure of claim 9 wherein the circuit component is a bond pad.

11. The inductive structure of claim 1 wherein the inductor forms a portion of an RLC shunt.

12. The inductive structure of claim 1 wherein the inductor forms a portion of an electrostatic discharge (ESD) circuit.

13. The inductive structure of claim 12 wherein the inductor is configured to trigger the ESD circuit.

14. The inductive structure of claim 1 wherein the conductive members are conductive columns.

15. The inductive structure of claim 2 wherein individual ones of the loops include multiple planar windings.

16. The inductive structure of claim 2 wherein the loops are electrically coupled together in series.

17. The inductive structure of claim 2 wherein—
   the electrically insulative material is an oxide material;
   the electrically conductive material is tungsten; and
   the second layers further include a nitride material at least partially around the tungsten.

18. The inductive structure of claim 2 wherein the plurality of tiers includes more than one hundred tiers.

19. The inductive structure of claim 2 wherein the loops have different radii.

20. The inductive structure of claim 2 wherein the inductor is configured to be electrically coupled to a 3D-NAND memory array.

* * * * *